US006873003B2

(12) United States Patent
Casarotto et al.

(10) Patent No.: US 6,873,003 B2
(45) Date of Patent: Mar. 29, 2005

(54) NONVOLATILE MEMORY CELL (75) Inventors: Daniele Casarotto, Wappingers Falls, NY (US); Klaus Hummler, Poughkeepsie, NY (US)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/248,985

(22) Filed: Mar. 6, 2003

(65) Prior Publication Data

US 2004/0173839 A1 Sep. 9, 2004

(51) Int. Cl.⁷ ............................................ H01L 29/788
(52) U.S. Cl. ...................... 257/315; 257/302; 257/306; 257/315; 257/316; 257/317; 257/330
(58) Field of Search ................................ 257/315, 316, 257/317, 306, 302, 330

(56) References Cited

U.S. PATENT DOCUMENTS

| 5,071,782 A | | 12/1991 | Mori |
| 5,146,426 A | | 9/1992 | Mukherjee et al. |
| 5,399,516 A | | 3/1995 | Bergendahl et al. |
| 5,467,305 A | | 11/1995 | Bertin et al. |
| 5,859,451 A | * | 1/1999 | Narita ........................ 257/306 |
| 5,895,946 A | * | 4/1999 | Hamamoto et al. ......... 257/302 |
| 6,025,626 A | * | 2/2000 | Tempel ....................... 257/315 |
| 6,410,391 B1 | | 6/2002 | Zelsacher |
| 6,483,146 B2 | | 11/2002 | Lee et al. .................... 257/317 |
| 6,486,032 B1 | | 11/2002 | Lin et al. |
| 6,846,032 B2 | | 11/2002 | Lin et al. .................... 438/266 |
| 6,501,123 B2 | | 12/2002 | Liu ............................. 257/315 |
| 6,501,689 B2 | | 12/2002 | Kuroda et al. .............. 365/200 |
| 6,521,498 B2 | * | 2/2003 | Zandt In't et al. .......... 438/270 |
| 6,613,672 B1 | * | 9/2003 | Wang et al. ................ 438/689 |
| 6,674,124 B2 | * | 1/2004 | Hshieh et al. .............. 257/330 |
| 6,734,078 B2 | * | 5/2004 | Chu ............................ 438/389 |

FOREIGN PATENT DOCUMENTS

| DE | 199 30 748 A1 | 2/2001 |
| EP | 0 485 018 A2 | 5/1992 |
| EP | 0 560 069 A1 | 9/1993 |
| EP | 0 562 257 A1 | 9/1993 |

* cited by examiner

*Primary Examiner*—David Nelms
*Assistant Examiner*—Mai-Huong Tran
(74) *Attorney, Agent, or Firm*—Slater & Matsil, L.L.P.

(57) ABSTRACT

A non-volatile memory cell which can be easily integrated into processes for forming DRAM cells using trench capacitors is disclosed. The non-volatile memory cell comprises a transistor formed in a trench created below the top surface of the substrate. The transistor includes a U-shaped floating gate which lines the trench. A dielectric layer surrounds the floating gate, isolating it from the trench sidewalls and bottom as well as a control gate located in the inner trench formed by the floating gate. A buried diffusion region abuts the bottom of the floating gate. First and second diffusion regions are located on first and second sides of the trench. The first diffusion region is on the surface of the substrate while the second diffusion region extends from the surface and couples to the buried diffusion region. A wordline is coupled to the control gate.

50 Claims, 7 Drawing Sheets

NONVOLATILE MEMORY CELL

BACKGROUND OF INVENTION

Nonvolatile memory ICs, such as EEPROMS or flash, are used for storing digital information. Nonvolatile memory ICs maintain information stored in the memory cells even after power is removed or interrupted. Various applications use non-volatile memories, such as digital cameras or even replacements for the hard disk of a personal computer (PC). In some applications, such as system-on-chip (SoC), it may be desirable to integrate both nonvolatile and volatile memory on the same IC.

However, conventional techniques for forming non-volatile memory cells are quite complex. Furthermore, such processes are quite different from the processes of forming volatile memory cells, such as dynamic random access memories (DRAMs). This makes it difficult and costly to integrate both types of memory cells on a single IC.

From the foregoing discussion, it is desirable to provide a nonvolatile memory cell which can be easily fabricated, particularly one which can be fabricated along with volatile memory cells, such as DRAMs.

SUMMARY OF INVENTION

The invention relates generally to non-volatile memory cells. More particularly, the invention relates to non-volatile memory cells which can be easily integrated into a process for forming volatile memory cells, such as those employing trench capacitors.

In one embodiment, the nonvolatile memory cell is formed in a trench created below the top surface of a substrate. A transistor is disposed in the trench. The transistor comprises floating and control gates. The floating gate lines the trench, forming a U shape. A floating gate dielectric surrounds the floating gate, isolating the gate from the substrate, the trench below, and the control gate located on the inner trench formed by the floating gate. A buried diffusion region abuts the bottom of the floating gate, separated by the floating gate dielectric. First and second diffusion regions are located on first and second sides of the trench. The first diffusion region is on the surface of the substrate while the second diffusion region extends from the surface down to the buried diffusion region.

In one embodiment, the nonvolatile memory cell further comprises a trench capacitor located below the trench. The dimensions of the trench is about 2F×nF, where n is a number equal to or greater than 2. Such dimensions advantageously enable the nonvolatile memory cell to be easily integrated into processes for forming DRAMs using trench capacitors. The gates of the transistor are formed of, for example, polysilicon.

DETAILED DESCRIPTION

Figure 1:
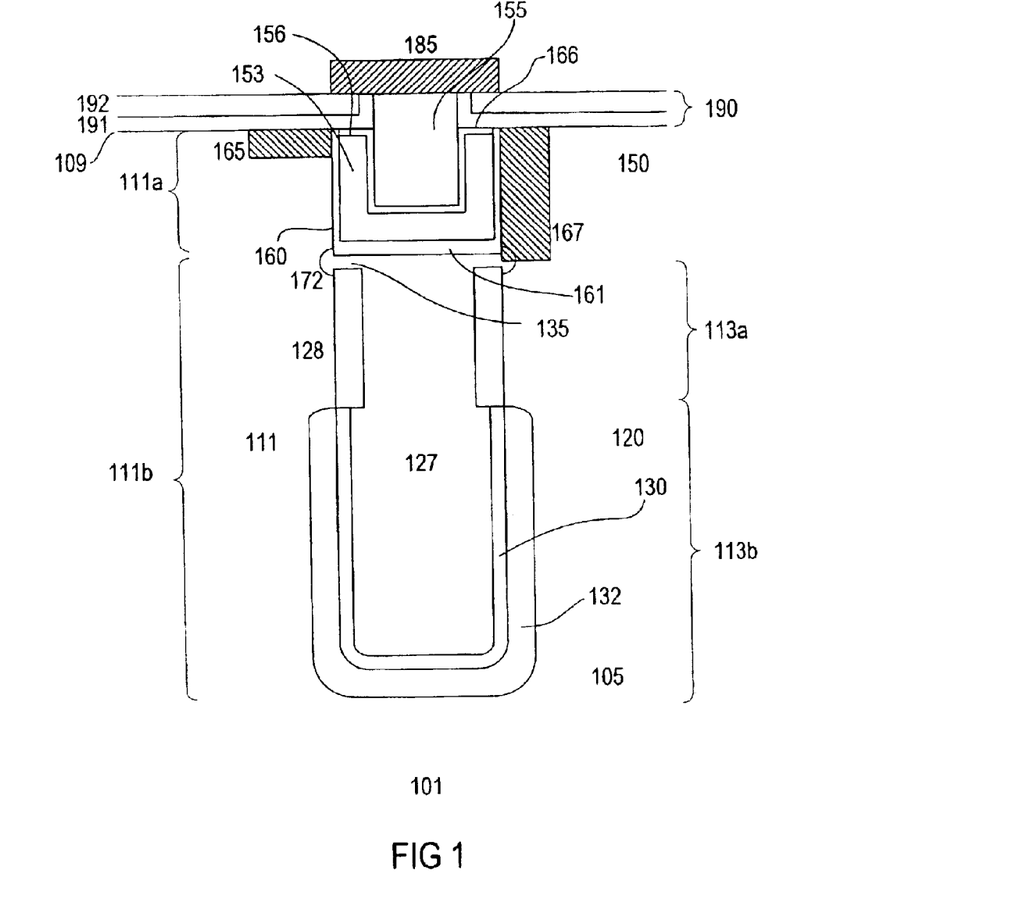
FIG. 1 shows a non-volatile memory cell in accordance with one embodiment of the invention.

Referring to FIG. 1, a cross-sectional and top view of a nonvolatile memory cell 101 in accordance with one embodiment of the invention is shown. The nonvolatile memory cell can be used in ICs, such as memory ICs. Other types of ICs are also useful. In one embodiment, the non-volatile memory cells are used in an IC which includes volatile memory cells (e.g., DRAMs). The non-volatile memory cells can serve as electrical fuses (e-fuses). E-fuses are used, for example, to facilitate redundancy for repairing defective cells in a memory array of an IC. Other purposes are also useful.

Typically, in IC fabrication, a plurality of ICs are formed on the wafer in parallel. After processing is finished, the wafer is diced to separate the ICs into individual chips. The chips are then packaged, resulting in a final product that is used in, for example, consumer products such as computer systems, cellular phones, digital cameras, personal digital assistants (PDAs), and other products.

In one embodiment, the nonvolatile memory cell can easily be integrated into the process for forming dynamic memory cells having trench capacitors with vertical gate transistors. Such memory cells are described in, for example, Weis et. al., "A Highly Cost Efficient $8F^2$ DRAM Cell with a Double Gate Vertical Transistor Device for 100 nm and Beyond", International Electron Device Meeting IEDM, Washington (2001), which is herein incorporated by reference for all purposes. The memory cell, in one embodiment, comprises a trench capacitor 120 formed in a trench 111 in a substrate 105. The trench capacitor occupies a lower portion 111b of the trench. In one embodiment, the lower portion of the trench comprises top and bottom parts 113a–b. A relatively thick dielectric collar 128 lines the upper part while a node dielectric 130 lines the bottom part. Doped polysilicon (poly) 127, for example, fills the trench, forming the storage node.

In one embodiment, a buried plate 132 can surround the lower portion of the trench, separated from the storage node by the node dielectric. The buried plate, for example, is formed during the process for forming trench capacitors. The buried plate can be formed by various conventional techniques. Such techniques, for example, include the use of a doped silicon layer such as poly or epi lining the lower portion of the trench, implanting or diffusing dopants into the lower portion of the trench, or outdiffusing dopants into the substrate surrounding the lower portion from a dopant source such as a doped silicate glass lining the lower portion of the trench. A buried strap 135 is located above the trench capacitor. The buried strap comprises, for example, amorphous silicon or poly.

A transistor 150 is provided in the upper trench 111a above the trench capacitor. In one embodiment, the transistor comprises floating and control gates 153 and 155. The floating gate comprises a poly layer lining the upper trench, creating a U shape. In one embodiment, the poly layer is doped. The dopant preferably is n-type dopant such as phosphorous (P) or arsenic (As). P-type dopants (e.g., boron) can also be used to dope the poly layer.

A floating gate (FG) dielectric layer 160 surrounds the floating gate. The FG dielectric layer isolates the transistor from the capacitor and substrate. Preferably, the top surface 156 of the floating gate is below the surface 109 of the substrate to accommodate the FG dielectric layer. The top surface 166 of the FG dielectric layer is preferably at least coplanar or below the surface of the substrate. More preferably, the top surface of the FG dielectric layer is below the surface of the substrate.

In one embodiment, the FG dielectric layer comprises silicon oxide. Other dielectric materials, such as silicon nitride, can also be used. Multiple dielectric layers which form a dielectric sandwich (e.g., oxide-nitride-oxide) are also useful to form the dielectric layer. The various portions or sections of the FG dielectric layer need not be formed from the same material or have the same thickness. For example, the bottom portion 161 of the FG dielectric layer separating the transistor and capacitor is typically thicker than the other portions. This is to ensure that the capacitor and transistor are electrically isolated from each other.

The control gate is located in the trench in the interior portion of the floating gate. The FG dielectric layer isolates the floating and control gates. Preferably, the top surface of the control gate is above the surface of the substrate. Alternatively, the top surface of the control gate can be co-planar to or below the surface of the substrate.

A first diffusion region 165 is located on the surface of the substrate on a first side of the upper trench. A buried diffusion region 172 is provided surrounding the upper trench abutting the buried strap and overlapping the upper trench and dielectric collar. The first and buried diffusion regions serve as the source and drain of the transistor. To provide access to the buried diffusion region, a second diffusion region 167 can be provided on a second side of the trench, extending from the surface of the substrate to the buried diffusion region. The second diffusion region should at least overlap a portion of the buried diffusion to create an electrical coupling.

On the surface of the substrate, an interlevel dielectric (ILD) layer 190 is provided. The ILD layer comprises, for example, silicon oxide. Other dielectric materials can also be used. A wordline 185 is coupled to the control gate. For applications where the control gate extends above the surface of the substrate, it can be coupled to the wordline directly. Alternatively, a contact can be used to couple the wordline to the control gate. The ILD provides isolation between the wordline and the layers below.

In one embodiment, the ILD layer comprises first and second sub-layers 191 and 192. The first sublayer can be etched selective to the second sublayer and FG dielectric material on the top surface of the floating gate. This is particularly useful to protect the FG dielectric from damage when contacts coupling to the diffusion regions are formed. The contacts are coupled to conductors, for example, the bitlines. The conductor's may be at a different level than the wordline. An additional ILD layer can be used to separate the wordline levels.

The operation of the nonvolatile memory cell is similar to that of conventional EPROMs with floating gates. For example, if properly biased, hot electrons will be created at the drain (e.g., diffusion region 172) of the transistor. Some of the hot electrons will be collected by the floating gate. Since the floating gate is completely surrounded by the FG dielectric layer, they can be stored indefinitely in the cell. The presence or absence of electrons in the floating gate changes the threshold of the transistor. Thus the memory cell can be configured to store a 1 or 0, based on the presence or absence of electrons in the floating gate. To provide a rewritable memory cell, the floating gate can be erased by UV or electrical techniques, as known in the art.

Figure 2:
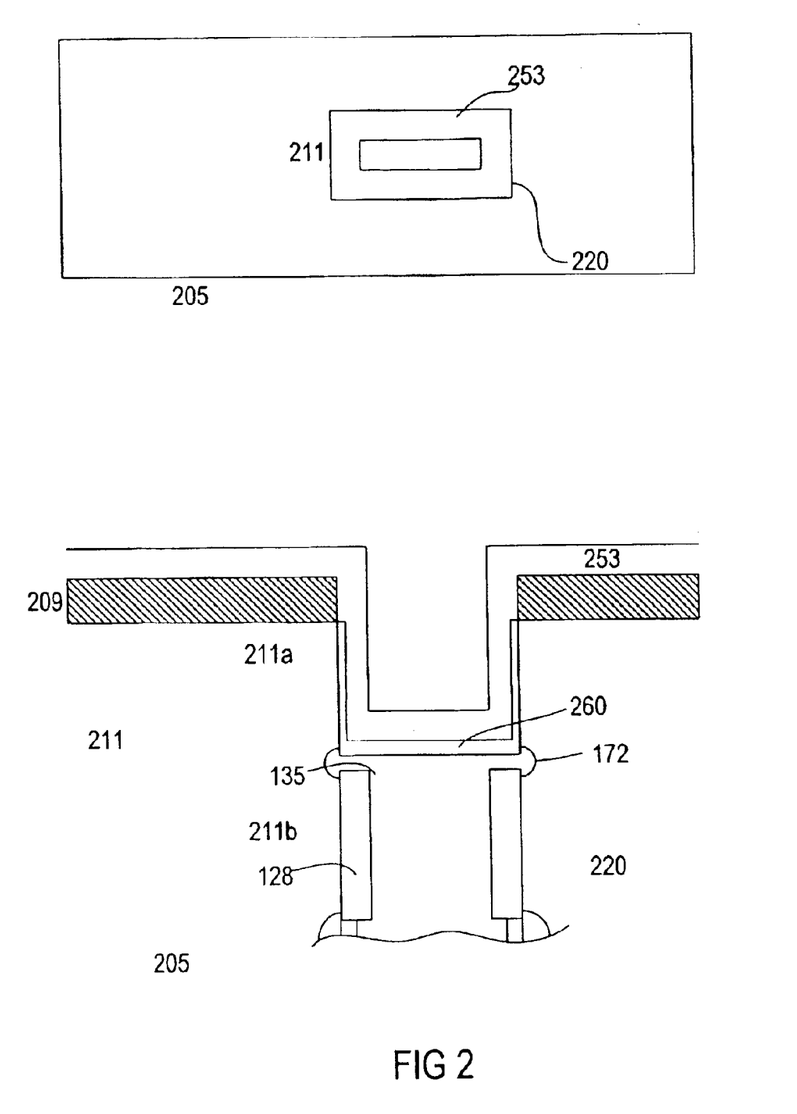
FIGS. 2–7 show a process for forming a non-volatile memory IC in accordance with one embodiment of the invention.

FIGS. 2–7 show cross-sectional and top views of a process for forming a nonvolatile memory cell in accordance with one embodiment of the invention. As shown in FIG. 2, a substrate 205 is provided. The substrate comprises, for example, silicon. Other types of substrates such as gallium arsenide, germanium or silicon on insulator (SOI) are also useful. The substrate, in one embodiment, is prepared to include a trench capacitor (partially shown) 220. The trench capacitor is formed in a lower portion 211b of a trench 211 in the substrate. Various conventional techniques can be used to form the trench capacitor. Such techniques are described in, for example, Weis et. al., "A Highly Cost Efficient $8F^2$ DRAM Cell with a Double Gate Vertical Transistor Device for 100 nm and Beyond", International Electron Device Meeting IEDM, Washington (2001), which is already herein incorporated by reference for all purposes.

In one embodiment, the trench capacitor comprises a rectangular shape. Other shapes, such as circular, oval or elliptical, are also useful. The dimensions of the trench in which the capacitor is formed, in one embodiment, is about 2F×nF, where F is the feature size and n is a number greater or equal to 2. The feature size depends on the lithographic ground rule of the process. Forming capacitors with other size trenches is also useful. For non-rectangular shaped trenches, the dimension can be taken from the diameter in the width and length direction.

The capacitor includes a buried strap 135 above dielectric collar 128. The buried strap is used to form a buried diffusion region 172 by outdiffusing dopants from the capacitor. The buried diffusion region can be formed after the trench capacitor is completed or later on in the process flow. For example, the diffusion region can take into account of the thermal budget of the different processes to create the buried diffusion region.

As shown, an upper trench 211a is provided on the substrate. The upper trench is located above the trench capacitor. The upper trench is formed by recessing materials from the trench during formation of the trench capacitor. An etch stop layer 209 is provided on the surface of the substrate. The etch stop layer, for example, comprises a silicon nitride layer over a pad oxide layer. The pad oxide, for example, promotes adhesion between the nitride layer and substrate. The etch stop layer, for example, is part of the hard mask that is used to form the trench capacitor. Typically, the hard mask comprises a silicon oxide layer over the etch stop layer. The silicon oxide may be removed from the hard mask during processing of the trench capacitor.

A dielectric layer 260 is provided in the upper trench. The dielectric layer lines the trench sidewalls and top of the trench capacitor. The dielectric layer isolates the subsequently formed transistor from the trench side walls and capacitor. The dielectric layer can be formed, for example, in two separate steps. Forming the dielectric layer using other techniques is also useful. In one embodiment, the bottom portion is formed by depositing an oxide layer using, for example, HDP techniques. An etch is then used to remove the oxide from the sidewalls of the trench, while leaving oxide layer covering the top of the capacitor. A dielectric layer is then formed on the trench sidewalls. This oxide layer serves as the transistor dielectric. The transistor dielectric, in one embodiment, comprises silicon oxide formed by thermal oxidation. The thermal oxidation selectively forms the oxide layer on the substrate sidewalls and bottom of the upper trench. Alternatively, the oxide is deposited by chemical vapor deposition (CVD), covering the trench sidewalls, bottom, and substrate surface. Other dielectric materials or deposition techniques can also be used to form the dielectric layer.

A poly layer 253 is deposited on the surface of the substrate. In one embodiment, the poly comprises doped poly. Preferably, the poly is doped with n-type dopants such as P or As. Other types of dopants, such as p-type dopants, can also be used. The poly layer is deposited by, for example, conventional techniques such as CVD. The poly layer covers the surface of the substrate and lines the upper trench without filling it. Preferably, the poly layer lines the trench, leaving sufficient area (e.g. inner trench) to accommodate a control gate. The thickness of the poly layer is, for example, about 1–2F, depending on the size of the trench.

Figure 3:
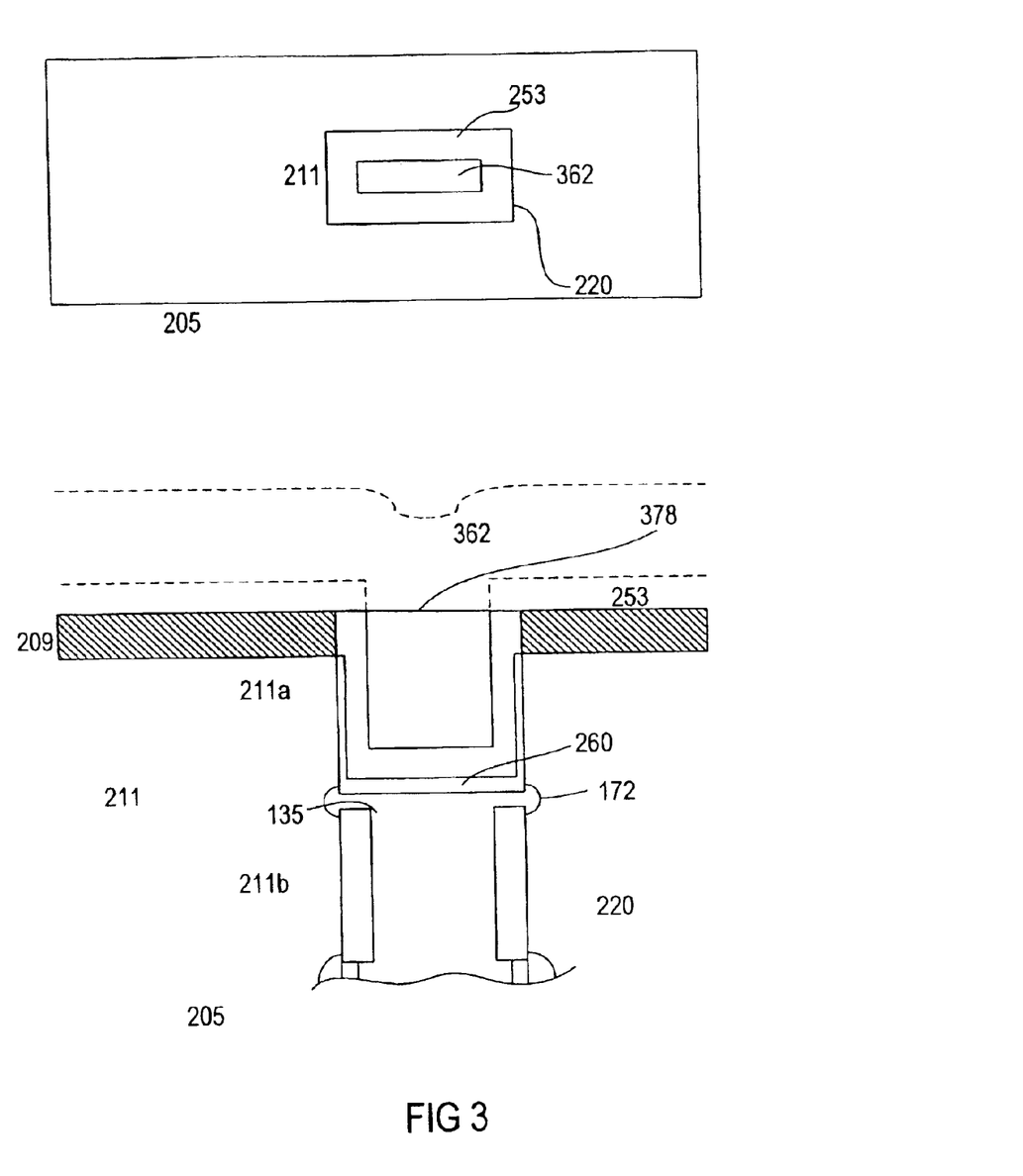

Referring to FIG. 3, a sacrificial layer 362 is deposited on the surface of the substrate to completely fill the upper trench. The sacrificial layer is formed from a material which can be removed selectively to the etch stop layer and poly. In one embodiment, the sacrificial layer comprises silicon oxide. Other types of materials can also be used. The sacrificial layer is deposited by, for example, CVD or other conventional techniques.

Excess sacrificial material and poly on the surface of the substrate are removed. In one embodiment, the removal of the excess material is achieved using a polishing process, such as chemical mechanical polish (CMP). The CMP stops on the etch stop layer, providing a planar surface 378 between the materials in the upper trench and etch stop layer.

Figure 4:
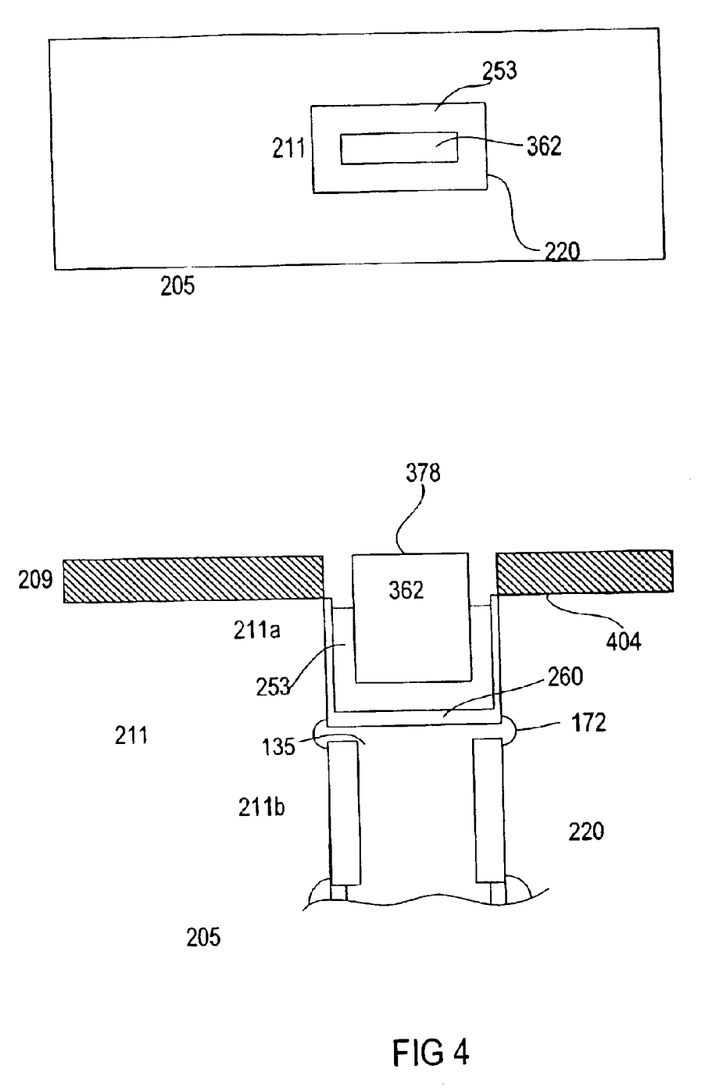

In FIG. 4, the poly in the trench is recessed. In one embodiment, the poly is recessed below the surface of the substrate 404. In one embodiment, the poly is recessed sufficiently to provide space for a dielectric layer to cover the surface of the poly. The upper surface of the dielectric layer should be below or coplanar with the surface of the substrate.

Figure 5:
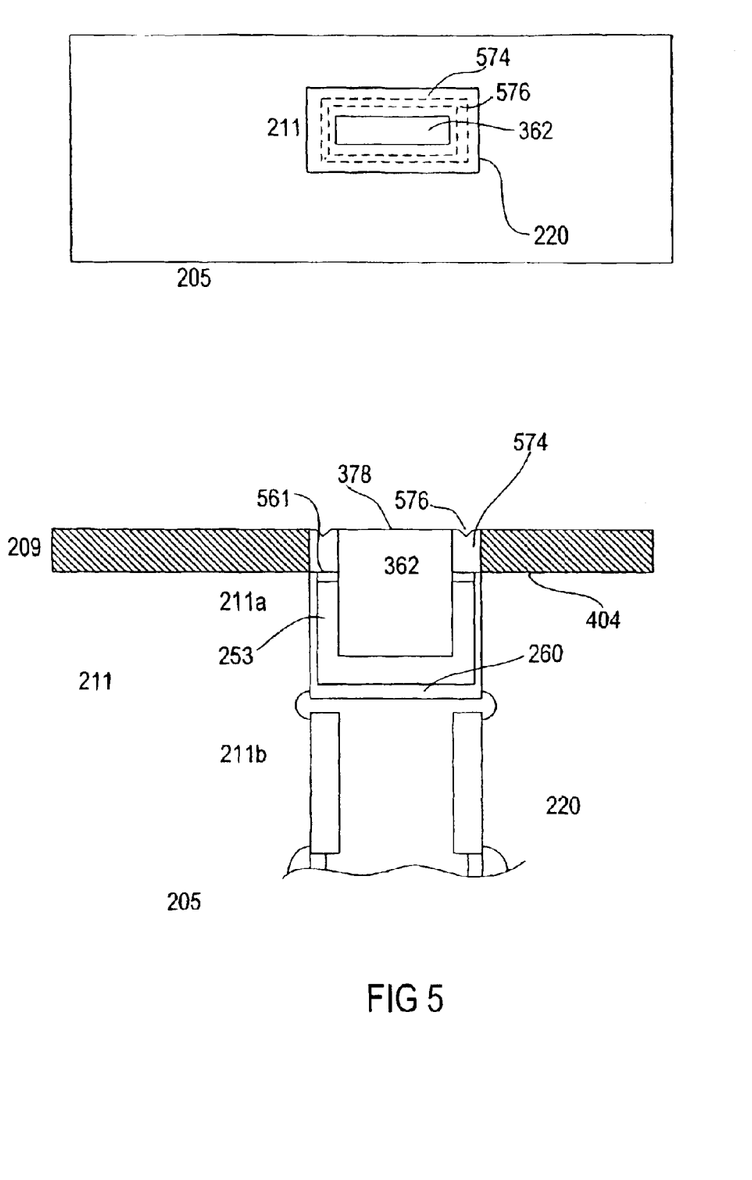

Referring to FIG. 5, an oxide layer 561 is formed on the surface of the poly layer. Preferably, the oxide layer is formed by thermal oxidation. This advantageously selectively forms the oxide layer on top of the poly surface. Other techniques for forming the oxide layer are also useful. After the oxide layer is formed, the void 574 above the oxide layer is filled. In one embodiment, the void is filled with a material to which the sacrificial layer can be removed selectively. In one embodiment, the void is filled with the same material as the etch mask. In one embodiment, the void is filled with silicon nitride. Various techniques can be used to deposit the material to fill the void, such as CVD.

In one embodiment, the process is compatible with conventional DRAM process for forming vertical transistor above a trench capacitor. As such, the silicon nitride layer is etched to form spacers on the side of the etch stop layer above the vertical gate of the DRAM cell. The etch, for example, comprises a dry etch selective to oxide. Other types of etch techniques are also useful. This etch removes the silicon nitride to expose the sacrificial layer. In some cases, this etch creates a divot 576 on the etched surface of the fill material in the void 574.

If DRAM cells which employ vertical transistors and trench capacitors are present, an etch is performed to remove the oxide layer to expose the gate of the vertical transistor. A poly layer is then deposited on the surface of the substrate, filling the opening between the nitride spacers above the vertical cell transistor. The surface of the substrate is then polished by CMP to remove excess poly, leaving a poly stud coupled to the gate of the vertical cell transistor.

Figure 6:
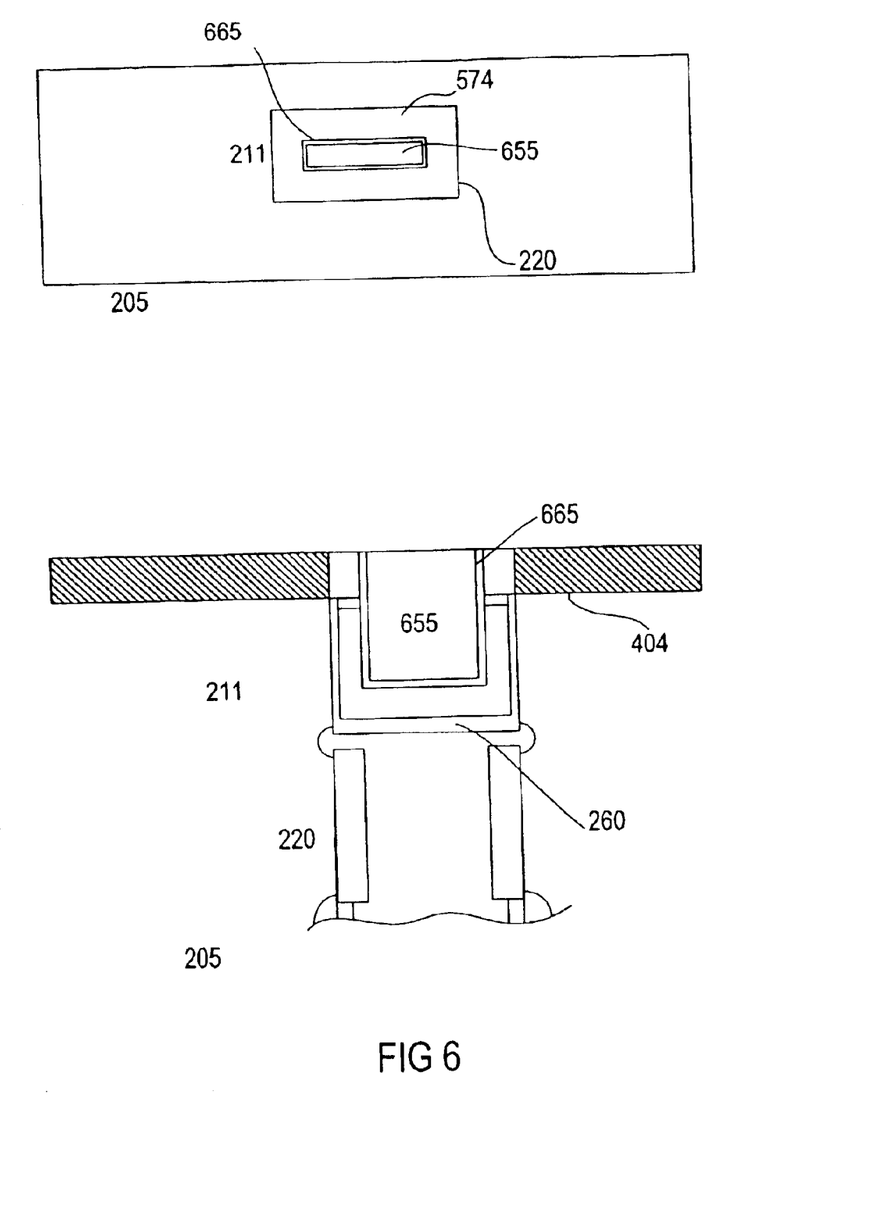

Referring to FIG. 6, the sacrificial layer is removed from the upper trench. In one embodiment, a wet etch selective to the etch stop layer and poly is used to remove the sacrificial layer. Other types of etch processes can also be used to remove the sacrificial layer. Since the wet etch is selective to poly, the poly stud and floating gate are not damaged by the etch.

After the sacrificial layer is removed, a dielectric layer 665 is formed to line the inner surface of the floating gate.

The dielectric layer, for example, comprises silicon oxide. Alternatively, the dielectric layer comprises multiple dielectric layers, such as oxide/nitride/oxide sandwich. The dielectric layer can be formed by, for example, CVD. Other techniques, such as thermal oxidation or nitridation, can also be used. A poly layer is then deposited on the substrate, filling the upper trench. Excess poly material is removed from the substrate surface by CMP, thus forming the control gate 655.

Figure 7:
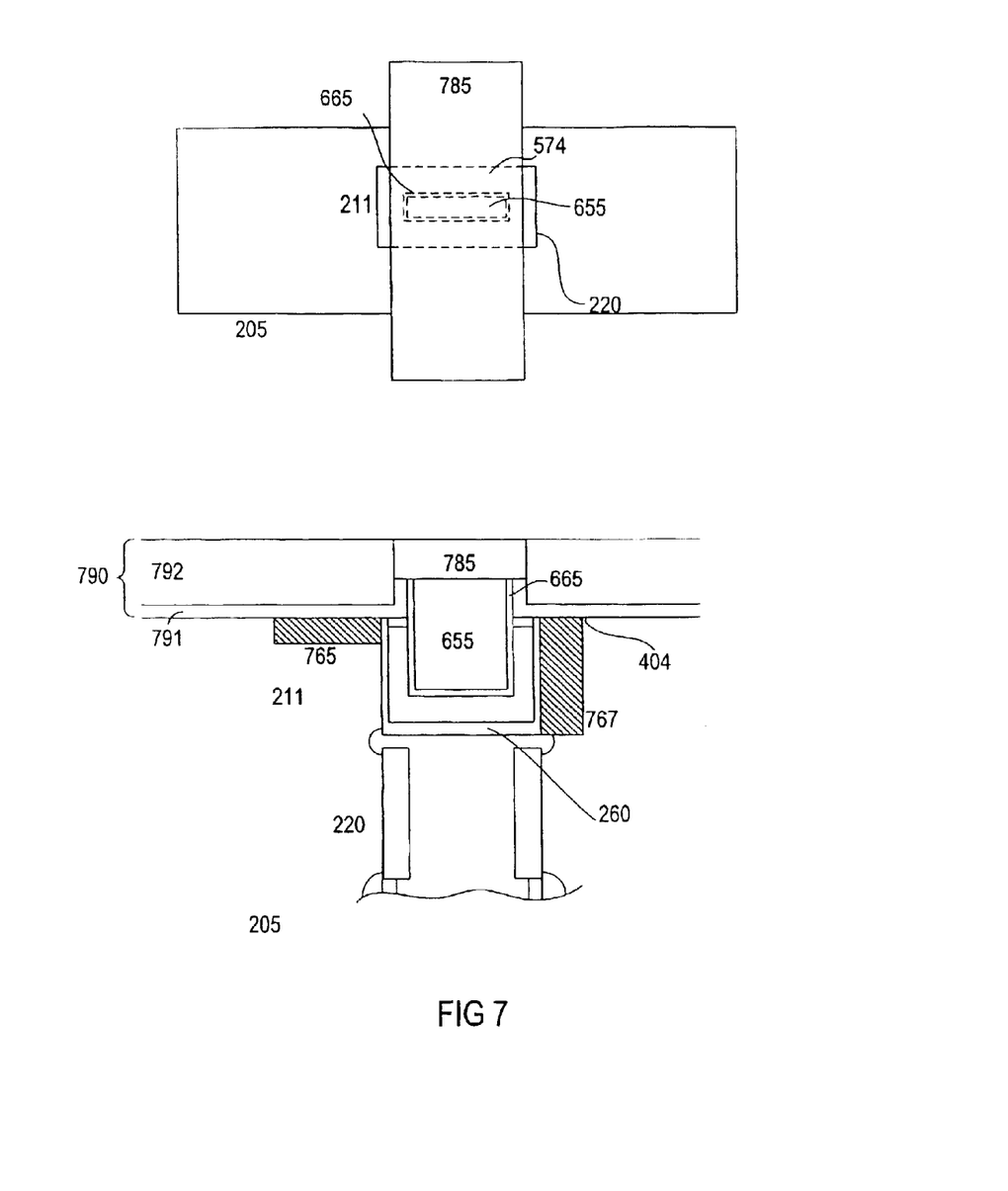

Referring to FIG. 7, the etch stop layer is removed, exposing the surface of the substrate. First and second diffusion regions 765,767 are formed on first and second sides of the trench. A screen oxide can be used to facilitate the implant to form the diffusion regions. In one embodiment, two separate implants are performed, one to form the first and the other to form the second diffusion region. The first implant, which forms the first diffusion region, for example, can be the same as that used to form the diffusion areas for transistors of the DRAM cells. The second implant is modified to form a diffusion region to contact the buried diffusion region. Implant masks can be used to selectively form the diffusion regions in the desired regions of the substrate. The screen oxide can be removed after the implants are completed.

After the diffusion regions are formed, a dielectric layer 790 is formed on the surface of the substrate to serve as an interlevel dielectric (ILD) layer. The ILD layer comprises, for example, silicon oxide. Other dielectric materials are also useful. In one embodiment, the dielectric layer comprises first and second sub-layers 791 and 792. Preferably, the first sub-layer can be etched selective to the materials of the second layer and the dielectric layer over the floating gate. This ensures that the floating gate is protected when the contact openings are formed to the first and second diffusion regions of the transistor are formed. In one embodiment, the first sub-layer comprises silicon nitride and the second one comprises silicon oxide.

The process continues to complete the non-volatile memory cell. For example, contacts to diffusion regions and wordline 785 coupled to the control gate are formed. Various conventional techniques can be used, for example, damascene, RIE, or a combination of both. In one embodiment, the contacts comprise tungsten and the wordline comprise poly. Other conductive materials can also be used As described, the process of forming the non-volatile memory cell can easily be integrated into the process for forming DRAM cells using trench capacitors and vertical gate transistors. This is particularly useful for ICs which employs both volatile and non-volatile memory, such as SoCs. This is facilitated by, for example, providing the non-volatile memory cell having a dimension of 2F×nF, where n is greater or equal to 2. This easily enables the formation of the floating and control gates without deviating significantly from the DRAM process. Alternatively, the non-volatile memory cells can be used in EPROM or flash applications. The non-volatile memory cells can be formed with other dimensions as desired. This is particularly useful for applications which do not include DRAMs using trench capacitors.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A nonvolatile memory cell comprising:
   a substrate having a top surface prepared with a trench;
   a transistor disposed in the trench, the transistor comprises floating and control gates, the floating gate lining the trench, forming a u-shape and having a bottom portion at a selected depth in said trench;
   a floating gate dielectric layer surrounding the floating gate including said bottom portion, separating the floating gate from the substrate and control gate, the control gate disposed in a trench formed by the floating gate, the control and floating gates separated by the floating gate dielectric layer;
   a buried diffusion region abutting said dielectric layer surround said bottom portion of said floating gate;
   a first diffusion region on the surface of the substrate on a first side of the trench; and
   a second diffusion region on a second side of the trench.

2. The nonvolatile memory cell of claim 1, wherein the memory cell serves as an e-fuse for redundancy for an array of memory cells.

3. The nonvolatile memory cell of claim 2 wherein the control gate extends above the top surface of the substrate.

4. The nonvolatile memory cell of claim 2 wherein the floating gate comprises a top surface below the surface of the substrate in order for at least a portion of the floating gate dielectric layer over the top surface of the floating gate to be disposed below the top surface of the substrate.

5. The nonvolatile memory cell of claim 4 wherein the control gate extends above the top surface of the substrate.

6. The nonvolatile memory cell of claim 1 further comprises a trench capacitor below the trench, the nonvolatile memory cell serves as an e-fuse for redundancy for an array of volatile memory cells with trench capacitors.

7. The nonvolatile memory cell of claim 6 wherein the control gate extends above the top surface of the substrate.

8. The nonvolatile memory cell of claim 6 wherein the floating gate comprises a top surface below the surface of the substrate in order for at least a portion of the floating gate dielectric layer over the top surface of the floating gate to be disposed below the top surface of the substrate.

9. The nonvolatile memory cell of claim 8 wherein the control gate extends above the top surface of the substrate.

10. The nonvolatile memory cell of claim 1 further comprises a trench capacitor below the trench.

11. The nonvolatile memory cell of claim 10 wherein:
    the control gate extends above the top surface of the substrate; and
    the floating gate comprises a top surface below the surface of the substrate in order for at least a portion of the floating gate dielectric layer over the top surface of the floating gate to be disposed below the top surface of the substrate.

12. The nonvolatile memory cell of claim 1 wherein the control gate extends above the top surface of the substrate.

13. The nonvolatile memory cell of claim 1 further comprises a trench capacitor below the trench, the nonvolatile memory cell serves as an e-fuse for redundancy for an array of volatile memory cells with trench capacitors.

14. The nonvolatile memory cell of claim 13 wherein the control gate extends above the top surface of the substrate.

15. A nonvolatile memory cell comprising:
    a substrate having a top surface prepared with a trench, said trench comprising dimensions equal to at least 2F×nF, where n is a whole number greater than or equal to 2;
    a transistor disposed in the trench the transistor comprises floating and control gates, the floating gate lining the trench, forming a u-shape:
    a floating gate dielectric layer surrounding the floating gate, separating the floating gate from the substrate and control gate, the control rated disposed in a trench formed by the floating gate, the control and floating gates separated by the floating gate dielectric layer;
    a buried diffusion region abutting a bottom of the trench;
    a first diffusion region on the surface of the substrate on a first side of the trench;
    a second diffusion region on a second side of the trench; and
    a trench capacitor below the trench.

16. The nonvolatile memory cell of claim 15 wherein:
    the control gate extends above the top surface of the substrate; and
    the floating gate comprises a top surface below the surface of the substrate in order for at least a portion of the floating gate dielectric layer over the top surface of the floating gate to be disposed below the top surface of the substrate.

17. The nonvolatile memory cell of claim 15, wherein the memory cell serves as an e-fuse for redundancy for an array of memory cells.

18. The nonvolatile memory cell of claim 15 wherein the control gate extends above the top surface of the substrate.

19. The nonvolatile memory cell of claim 15 wherein the floating gate comprises a top surface below the surface of the substrate in order for at least a portion of the floating gate dielectric layer over the top surface of the floating gate to be disposed below the top surface of the substrate.

20. A nonvolatile memory cell comprising:
    a substrate having a top surface prepared with a trench, said trench comprises a dimension equal to at least 2F×nF, where n is a whole number greater than or equal to 2;
    a transistor disposed in the trench, the transistor comprises floating and control gates, the floating gate lining the trench, forming a u-shape;
    a floating gate dielectric layer surrounding the floating gate, separating the floating gate from the substrate and control gate, the control gated disposed in a trench formed by the floating gate, the control and floating gates separated by the floating gate dielectric layer;
    a buried diffusion region abutting a bottom of the trench;
    a first diffusion region on the surface of the substrate on a first side of the trench;
    a second diffusion region on a second side of the trench; and
    a trench capacitor below the trench.

21. The nonvolatile memory cell of claim 20 wherein:
    the control gate extends above the top surface of the substrate; and
    the floating gate comprises a top surface below the surface of the substrate in order for at least a portion of the floating gate dielectric layer over the top surface of the floating gate to be disposed below the top surface of the substrate.

22. The nonvolatile memory cell of claim 20, wherein the memory cell serves as an e-fuse for redundancy for an array of memory cells.

23. The nonvolatile memory cell of claim 20 wherein the control gate extends above the top surface of the substrate.

24. The nonvolatile memory cell of claim 20 wherein the floating gate comprises a top surface below the surface of the substrate in order for at least a portion of the floating gate dielectric layer over the top surface of the floating gate to be disposed below the top surface of the substrate.

25. The nonvolatile memory cell of claim 20 further comprises a trench capacitor below the trench the nonvolatile memory cell serves as an e-fuse for redundancy for an array of volatile memory cells with trench capacitors.

26. A nonvolatile memory cell comprising:

a substrate having a top surface prepared with a trench;

a transistor disposed in the trench, the transistor comprising floating and control gates, the floating gate lining the trench, forming a u-shape;

a floating gate dielectric layer surrounding the floating gate, separating the float gate from the substrate and control gate, the control rated disposed in a trench formed by the floating gate, the control and floating gates separated by the floating gate dielectric layer;

a buried diffusion region abutting a bottom of the trench;

a first diffusion region on the surface of the substrate on a first side of the trench;

a second diffusion region on a second side of the trench; and first and second coupled to said first and second diffusion regions.

27. The nonvolatile memory cell of claim 26 wherein the floating and control gates comprise polysilicon.

28. The nonvolatile memory cell of claim 26 wherein the contacts are formed in an interlevel dielectric (ILD) layer.

29. The nonvolatile memory cell of claim 26 wherein the contacts are formed in an ILD layer, the ILD layer comprises first and second sublayers, the first sublayer disposed below the second sublayer, the first sublayer comprises a material which can be etched selective to the second sublayer and floating gate dielectric layer.

30. The nonvolatile memory cell of claim 29 wherein the first sublayer comprises silicon nitride and the second sublayer comprises silicon oxide.

31. The nonvolatile memory cell of claim 26 further comprises an interlevel dielectric (ILD) layer over the top surface of the substrate.

32. The nonvolatile memory cell of claim 31 wherein the ILD layer comprises first and second sublayers, the first sublayer disposed below the second sublayer, the first sublayer comprises a material which can be etched selective to the second sublayer and floating gate dielectric layer.

33. The nonvolatile memory cell of claim 32 wherein the first sublayer comprises silicon nitride and the second sublayer comprises silicon oxide.

34. The nonvolatile memory cell of claim 26, wherein the memory cell serves as an e-fuse for redundancy for an array of memory cells.

35. The nonvolatile memory cell of claim 26 wherein the control gate extends above the top surface of the substrate.

36. The nonvolatile memory cell of claim 26 wherein the floating gate comprises a top surface below the surface of the substrate in order for at least a portion of the floating gate dielectric layer over the top surface of the floating gate to be disposed below the top surface of the substrate.

37. The nonvolatile memory cell of claim 26 further comprises a trench capacitor below the trench, the nonvolatile memory cell serves as an e-fuse for redundancy for an array of volatile memory cells with trench capacitors.

38. A nonvolatile memory cell comprising:

a substrate having a top surface prepared with a trench;

a transistor disposed in the trench, the transistor comprises floating and control gates, the floating gate lining the trench, forming a u-shape;

a floating gate dielectric layer surrounding the floating gate, separating the floating gate from the substrate and control gate, the control gate disposed in a trench formed by the floating gate, the control and floating gates separated by the floating gate dielectric layer;

a buried diffusion region abutting a bottom of the trench;

a first diffusion region on the surface of the substrate on a first side of the trench; and a second diffusion region on a second side of the trench in electrical contact with said buried diffusion region.

39. The nonvolatile memory cell of claim 38, wherein the memory cell serves as an e-fuse for redundancy for an array of memory cells.

40. The nonvolatile memory cell of claim 38 wherein the control gate extends above the top surface of the substrate.

41. The nonvolatile memory cell of claim 38 wherein the floating gate comprises a top surface below the surface of the substrate in order for at least a portion of the floating gate dielectric layer over the top surface of the floating gate to be disposed below the top surface of the substrate.

42. The nonvolatile memory cell of claim 38 further comprises a trench capacitor below the trench, the nonvolatile memory cell serves as an e-fuse for redundancy for an array of volatile memory cells with trench capacitors.

43. The nonvolatile memory cell of claim 38 further comprises a trench capacitor below the trench.

44. The nonvolatile memory cell of claim 38 further comprises first and second contacts coupling to first and second diffusion regions.

45. The nonvolatile memory cell of claim 44 wherein the contacts are formed in an interlevel dielectric (ILD) layer.

46. The nonvolatile memory cell of claim 45 further comprises an interlevel dielectric (ILD) layer over the top surface of the substrate.

47. The nonvolatile memory cell of claim 44 wherein the contacts are formed in an ILD layer, the ILD layer comprises first and second sublayers, the first sublayer disposed below the second sublayer, the first sublayer comprise a material which can be etched selective to the second sublayer and floating gate dielectric layer.

48. The nonvolatile memory cell of claim 47 wherein the first sublayer comprises silicon nitride and the second sublayer comprises silicon oxide.

49. The nonvolatile memory cell of claim 38 wherein the floating and control gates comprise polysilicon.

50. The nonvolatile memory cell of claim 38 where said second diffusion region extends from said top surface of said substrate to said buried diffusion region abutting the bottom of said trench.

* * * * *

UNITED STATES PATENT AND TRADEMARK OFFICE
CERTIFICATE OF CORRECTION

PATENT NO. : 6,873,003 B2
DATED : March 29, 2005
INVENTOR(S) : Casarotto et al.

It is certified that error appears in the above-identified patent and that said Letters Patent is hereby corrected as shown below:

Column 8,
Line 1, delete "trench the" and insert -- trench, the --.
Line 3, delete ":" and insert -- ; --.

Column 10,
Line 48, delete "comprise" and insert -- comprises --.

Signed and Sealed this

Seventh Day of June, 2005

JON W. DUDAS
*Director of the United States Patent and Trademark Office*